United States Patent
Liao et al.

(10) Patent No.: US 9,583,594 B2
(45) Date of Patent: Feb. 28, 2017

(54) METHOD OF FABRICATING SEMICONDUCTOR DEVICE

(71) Applicant: UNITED MICROELECTRONICS CORP., Hsin-Chu (TW)

(72) Inventors: Duan Quan Liao, Singapore (SG); Yikun Chen, Singapore (SG); Ching Hwa Tey, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/829,649

(22) Filed: Aug. 19, 2015

(65) Prior Publication Data

US 2017/0025519 A1    Jan. 26, 2017

(30) Foreign Application Priority Data

Jul. 22, 2015 (CN) .......................... 2015 1 0432534

(51) Int. Cl.
| | |
|---|---|
| *H01L 23/535* | (2006.01) |
| *H01L 29/66* | (2006.01) |
| *H01L 21/768* | (2006.01) |
| *H01L 29/06* | (2006.01) |

(52) U.S. Cl.
CPC .. *H01L 29/66553* (2013.01); *H01L 21/76897* (2013.01); *H01L 23/535* (2013.01); *H01L 29/0657* (2013.01)

(58) Field of Classification Search
CPC .... H01L 21/00; H01L 21/8242; H01L 21/768
USPC .... 257/773, E21.241, E21.23; 438/183, 692, 438/242
See application file for complete search history.

(56) References Cited

U.S. PATENT DOCUMENTS

| | | | |
|---|---|---|---|
| 5,013,680 A | 5/1991 | Lowrey et al. | |
| 5,102,815 A * | 4/1992 | Sanchez | 438/305 |
| 5,429,988 A | 7/1995 | Huang et al. | |
| 8,901,016 B2 | 12/2014 | Ha et al. | |
| 2005/0282318 A1* | 12/2005 | Dao | 438/151 |
| 2006/0194378 A1* | 8/2006 | Yagishita | 438/183 |
| 2007/0117310 A1* | 5/2007 | Bai et al. | 438/242 |
| 2007/0249103 A1* | 10/2007 | Dao | 438/142 |
| 2012/0329268 A1* | 12/2012 | Soda et al. | 438/631 |
| 2015/0096958 A1* | 4/2015 | Lu et al. | 216/52 |

* cited by examiner

*Primary Examiner* — Sheng Zhu
(74) *Attorney, Agent, or Firm* — Winston Hsu; Scott Margo (57) ABSTRACT

A semiconductor device and a method of fabricating the same, the semiconductor device includes a hard mask layer and a plurality of spacers. The hard mask layer is disposed on a target layer and has a first material and a second material. The spacers are disposed on the hard mask layer, wherein a first portion of the spacers is disposed on the first material, and a second portion of the spacers is disposed on the second material.

15 Claims, 7 Drawing Sheets

METHOD OF FABRICATING SEMICONDUCTOR DEVICE

BACKGROUND OF THE INVENTION

1. Field of the Invention

The invention relates to a semiconductor device and a method of forming the same, and more particularly, to a semiconductor device being formed through a sidewall image transference process and a method of forming the same.

2. Description of the Prior Art

In recent years, as the continuous decrease of the sizes of semiconductor devices and the increase of the stacking and integration density of semiconductor devices, the photolithography process approaches physical limitation such that the costs of design, process development, and photomask rise dramatically. Therefore, many traditional process and fabrication method cannot meet the fabrication requirement anymore. In current techniques, in order to achieve sub-lithographic features, an immersion photolithography process in corporation with the argon fluoride (ArF) laser tool is performed for further improve the resolution. In addition, the manufacturer also provides self-aligned double-patterning (SADP) process, also known as sidewall image transfer (SIT) technique, to form required microminiature components.

Generally, the sidewall image transfer process includes firstly forming a plurality of sacrificial patterns on a substrate, wherein the dimension of such sacrificial patterns is substantially greater or equal to the critical dimension of photolithography. Then, spacers are formed on sidewalls of the sacrificial patterns through a deposition and an etching process. Since the dimension of the spacers may be smaller than the critical dimension, patterns of the spacers may be transferred into the substrate by using the spacers as mask to form a smaller fin structure. However, as the size of the semiconductor devices shrink, the electrical and physical requirements in each part of the devices become critical, like the dimensions and shapes of the wiring and the transistor and the spacing therebetween for example. Thus, how to achieve standard requirements and overcome the physical limitations has become an important issue in the industry of the semiconductor.

SUMMARY OF THE INVENTION

It is one of the primary objectives of the present invention to provide a semiconductor device and a method of forming the same, which may enable to improve the critical dimension of the device.

To achieve the purpose described above, the present invention provides a semiconductor device including a mask layer and a plurality of spacers. The mask layer is disposed on a target layer and includes a first material and a second material. The spacers are disposed on the mask layer, wherein a first portion of the spacers is disposed on the first material, and a second portion of the spacers is disposed on the second material.

To achieve the purpose described above, the present invention provides a method of forming a semiconductor device, including following steps. First of all, a first pattern is formed on a target layer. Next, a plurality of second patterns is formed on the target layer, wherein at least one of the second patterns crosses the first pattern. Then, a plurality of the spacers is formed to surround the second patterns, wherein the spacers are disposed on the first pattern. Finally, a removing process is performed to remove a portion of the target layer by using the spacers and the first pattern as a mask.

According to the above, the semiconductor device and the forming method thereof in the present invention mainly replaces a portion of the hard mask layer with the blocking pattern, and then forms the sacrificial patterns and the spacers on the hard mask layer, for blocking a portion of the patterns of the spacers. In this way, the semiconductor device formed accordingly may obtain specific layout. Since the blocking pattern of the present embodiment is formed below the spacers, and being defined by an opening pattern, the critical dimension of the blocking pattern may be precisely controlled, substantially being 20 nm to 60 nm for example. According to these, the present invention is able to form blocking patter in relative smaller dimension, so that, the semiconductor device formed accordingly may obtain further specific layout.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 5 to FIG. 13 are schematic diagrams illustrating a method of forming a semiconductor device according to a second embodiment of the present invention, wherein FIG. 5, FIG. 8, and FIG. 13 show top views of the semiconductor device in forming steps, and FIG. 6 and FIG. 9 show cross-sectional views taken along a cross line A-A' in FIG. 5 and FIG. 8.

DETAILED DESCRIPTION

To provide a better understanding of the present invention, preferred embodiments will be described in detail. The preferred embodiments of the present invention are illustrated in the accompanying drawings with numbered elements.

Figure 1:
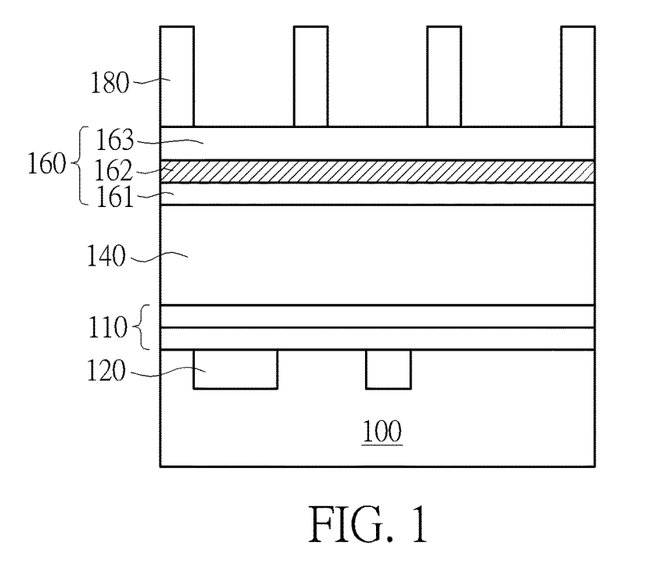
FIG. 1 to FIG. 4 are schematic diagrams illustrating a method of forming a semiconductor device according to a first embodiment of the present invention.

Please refer to FIG. 1 to FIG. 4, which are schematic diagrams illustrating a method of forming a semiconductor device according to the first embodiment of the present invention. First of all, a substrate 100 is provided. The substrate 100 may include a dielectric material, such as a dielectric layer, as shown in FIG. 1. In one embodiment, the dielectric layer may include a multilayer structure, for example a composite structure consisted of low dielectric constant (low-k) materials (having a dielectric constant less than 3.9), such as silicon oxide, silicon oxynitride and silicon carbonitride, but is not limited thereto. In another embodiment, the substrate 100 may include a semiconductor material, like, a silicon substrate, a silicon-containing substrate or a silicon-on-insulator (SOI) substrate for example, or a non-semiconductor material, like a glass substrate for example. The substrate 100 may include other semiconductor device formed therein or thereon. For example, in the embodiment of having the silicon substrate (not shown in the drawings), at least one metal oxide semiconductor (MOS) transistor (not shown in the drawings) may be formed on the silicon substrate, or at least one dielectric material layer (not shown in the drawings) is formed on the silicon substrate and at least one metal oxide semiconductor transistor (not shown in the drawings) may be formed in the dielectric material layer, but is not limited thereto.

Precisely speaking, at least one conductive layer 120 is formed in the substrate 100, and the conductive layer 120 may include any conductive unit or metal contact, such as a contact plug, via plug or wiring, as shown in FIG. 1. However, People skilled in the art shall easily realize that the conductive layer 120 of the present invention is not limited to the aforementioned types, and in the embodiment of having silicon substrate or other semiconductor substrate (not shown in the drawings), the conductive layer may include a gate electrode (not shown in the drawings) formed on the silicon substrate, or a source/drain region (not shown in the drawings) formed in the silicon substrate.

Next, a target layer 140, a hard mask layer 160 and at least one sacrificial pattern 180 are formed sequentially on the substrate 100. In one embodiment, the target layer 140 may include an inter-layer dielectric (ILD) layer, for example including a low dielectric constant (less than 3.9) material, like silicon oxide, silicon oxynitride or silicon carbonitride for example, but is not limited thereto. In another embodiment, the target layer 140 may also include other suitable materials, such as semiconductor materials, conductive materials or non-conductive materials. The hard mask layer 160 preferable includes a multilayer structure, for example being a composite structure consisted of a silicon oxide layer 161, a metal nitride layer 162 and a silicon oxide layer 163, as shown in FIG. 1, but is not limited thereto. In another embodiment, the hard mask layer 160 may be optionally omitted, so that, a sacrificial pattern (not shown in the drawings) may be formed directly on the target layer 140.

In the present embodiment, the formation of the sacrificial pattern 180 may be integrated into a conventional semiconductor process, for example, a general photolithographic etching pattern (PEP) process or a multi-patterning process may be performed to form a plurality of the sacrificial patterns 180 on the hard mask layer 160. The sacrificial patterns 180 may include polysiliocn or other materials having etching selectivity relative to the hard mask layer 160 underneath, such as silicon oxide or silicon nitride. However, people skilled in the art shall easily realize that the forming method, as well as the materials, of the sacrificial patterns 180 are not limited thereto, and may include other processes or materials which are well known in the art and will not be further detailed herein. Furthermore, in one embodiment, an etching stop layer 110 may be optionally formed on the substrate 100, before the target layer 140 is formed, as shown in FIG. 1.

Figure 2:
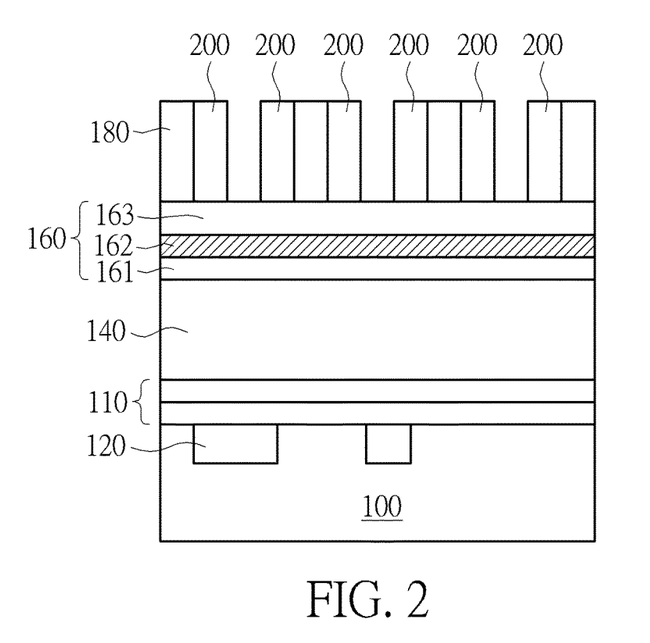

Then, a plurality of spacers 200 is formed to surround the sacrificial patterns 180, as shown in FIG. 2. Precisely, the forming method of the spacers 200 may includes firstly forming a spacer material layer (not shown in the drawings) on the substrate 100 to cover the sacrificial patterns 180, and performing an etching back process to completely remove the spacer material layer on top surfaces of the sacrificial patterns 180, so as to form the spacers 200 surrounding the sacrificial patterns 180 and adjacent thereto. In one embodiment, the spacers 200 preferably include titanium dioxide ($TiO_2$) or other materials having etching selectivity relative to the sacrificial patterns 180 and the hard mask layer 160, such as tungsten (W), tantalum nitride (TaN) or titanium nitride (TiN), but are not limited thereto.

Figure 3:
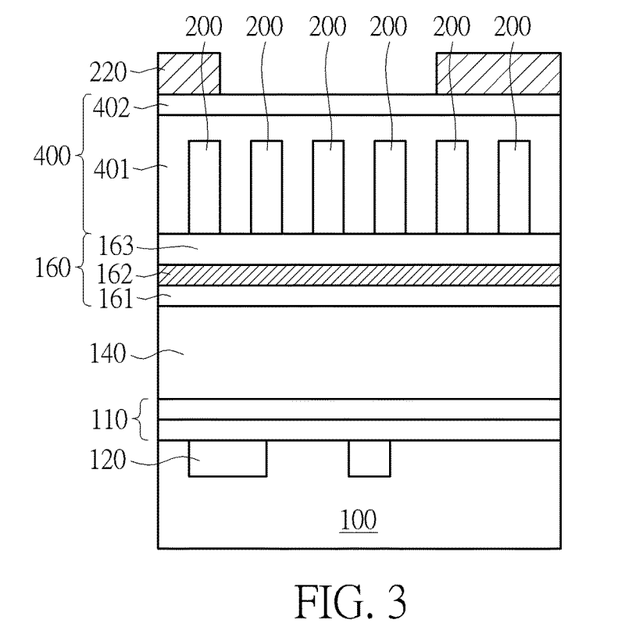

Following these, the sacrificial patterns 180 are completely removed, and a blocking pattern 220 is formed on the hard mask layer 160 to cross and to cover at least one of the spacer 200. Specifically, a sacrificial layer 400 may be formed previously, before the blocking pattern 220 is formed, and the sacrificial layer 400 may include materials having etching selectivity relative to the hard mask layer 160 and better gap-filling ability, like anti-reflective coating (ARC) materials, polysilicon or oxide materials for example, so as to completely cover the hard mask layer 160 and the spacers 200 formed on the hard mask layer 160. In a preferably embodiment, the sacrificial layer 400 may optionally include a composite structure, for example including a silicon-containing hard mask (SHB) layer 401 and an organic dielectric (ODL) layer 402, as shown in FIG. 3, wherein the organic dielectric layer 402 may be made of 365 nm I-line photoresist material or novolac resin, but is not limited thereto.

Figure 4:
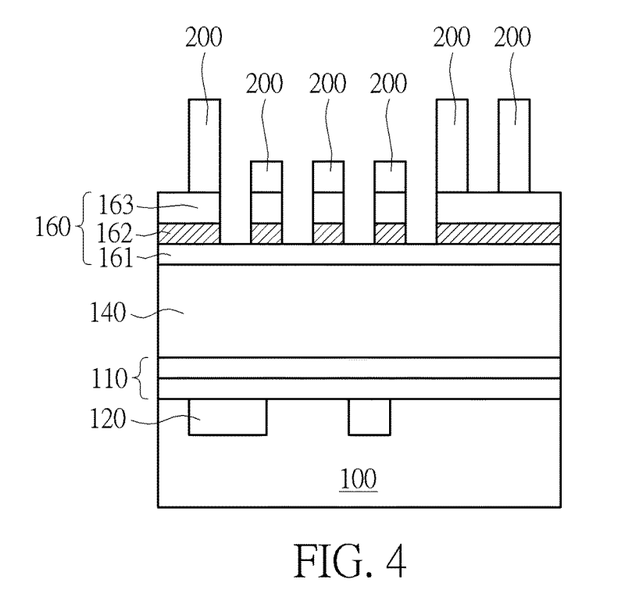

After that, an etching process, such as a dry etching process, a wet etching or a sequentially performed dry and wet etching process, is performed by using the spacers 200 and the blocking pattern 220 as a mask, to transfer patterns of the spacers 200 which are not blocked by the blocking pattern 220 to the hard mask layer 160 underneath. In the present embodiment, the patterns of the spacers 200 may be firstly transferred to a portion of the hard mask layer 160, for example, only the silicon oxide layer 163 and the metal nitride layer 162, but not limited thereto. In another embodiment (not shown in the drawings), the patterns of the spacers 200 may also be transferred to the whole hard mask layer 160, optionally. However, it is worth noting that, a portion of the spacers 200 is blocked by the blocking pattern 220, so that, only the patterns of the spacers 200 which are not blocked by the blocking pattern 220 may be successfully transferred to the hard mask layer 160, as shown in FIG. 4.

In the following, after completely removing the blocking pattern 220, the rest of the sacrificial layer 400 and spacers 200, patterns of the hard mask layer 160 may be further transferred to the target layer 140 formed below, thereby forming at least one opening (not shown in the drawings) directly connecting to the conductive layer 120. It is noted that, since the blocking pattern 220 has partially blocked the patterns of the spacers 220 in the aforementioned process, the opening formed according to the spacers 220 may be divided into two parts, or be formed only in particular region. According to these, other semiconductor process, such as a silicidation process or a plug process, may be optionally performed in the subsequent process, to form a semiconductor device (not shown in the drawings), such as a contact plug, a wiring or a transistor, directly contacting to the conductive layer 120, thereby forming the semiconductor device having specific layout in the following processes.

Through the aforementioned processes, the semiconductor device according to the first embodiment of the present invention is obtained. Please note that, the detailed dimensions and relative ratio of the sacrificial pattern, the spacers and the blocking pattern of the present invention are not limited to that shown in FIGS. 1-4, and may be further adjusted according to practical requirements. In the first embodiment of the present invention, the forming method thereof utilizes the blocking pattern to block a portion of the spacers, for partially blocking the patterns of the spacers, such that, the semiconductor device formed accordingly may obtain specific layout. However, due to the critical dimensions of the blocking pattern probably being limited by the photolithography and etching process, optical proximity effects (OPCs) may easily occur in the photolithographic process during the formation of the blocking pattern especially while the size of semiconductor device has shrunk to a particular degree, thereby causing overexposure or underexposure to the blocking patterns which may not meet the practical requirements of the processes. Thus, in some cases, the dimension of the blocking pattern may not be properly controlled, so that, the deformed or dislocated blocking patterns may be formed accordingly, damaging to the expected layout, and even affecting the performance of the semiconductor device.

The following description will detail the different embodiments of the semiconductor device and the forming method thereof of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 5:
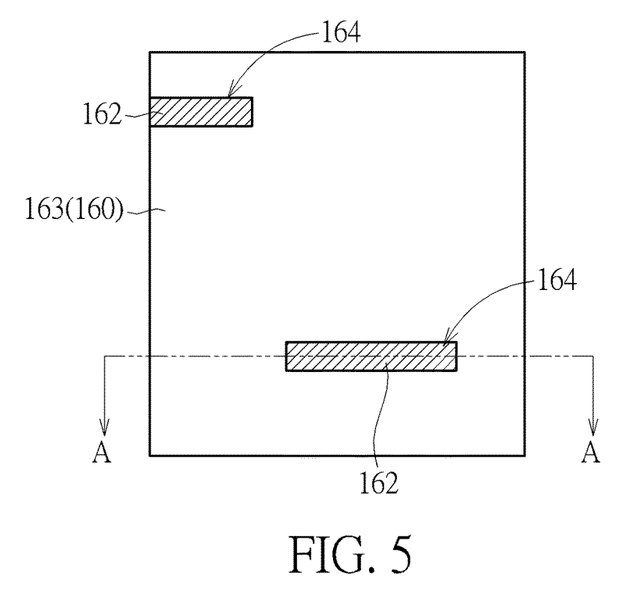
Figure 6:
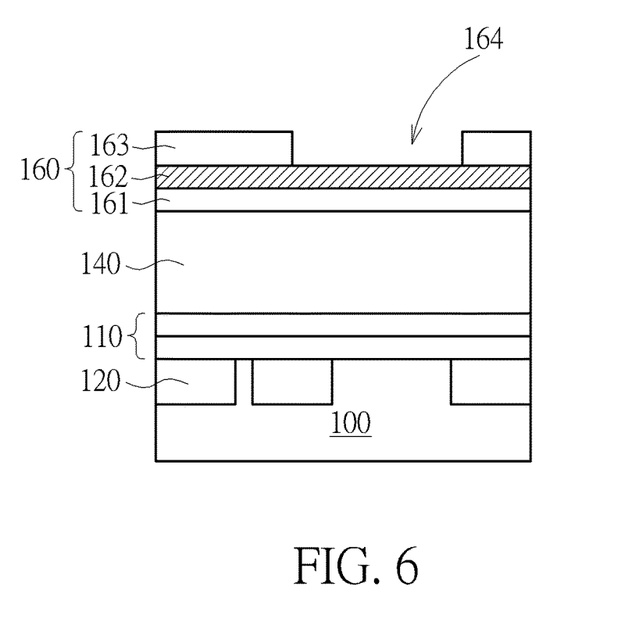
Figure 7:
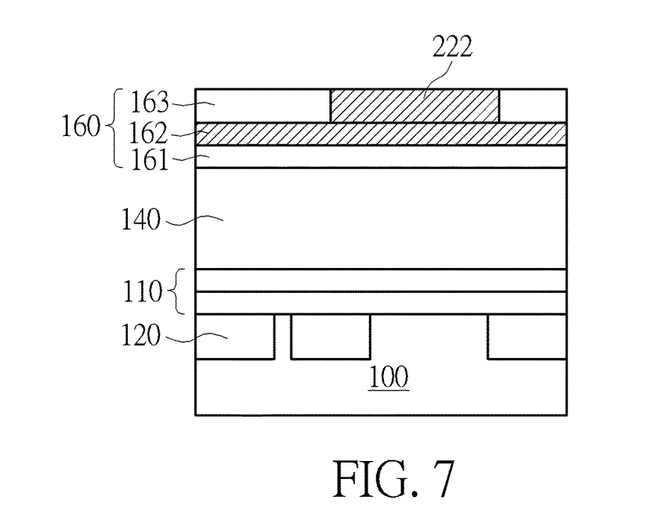
Figure 8:
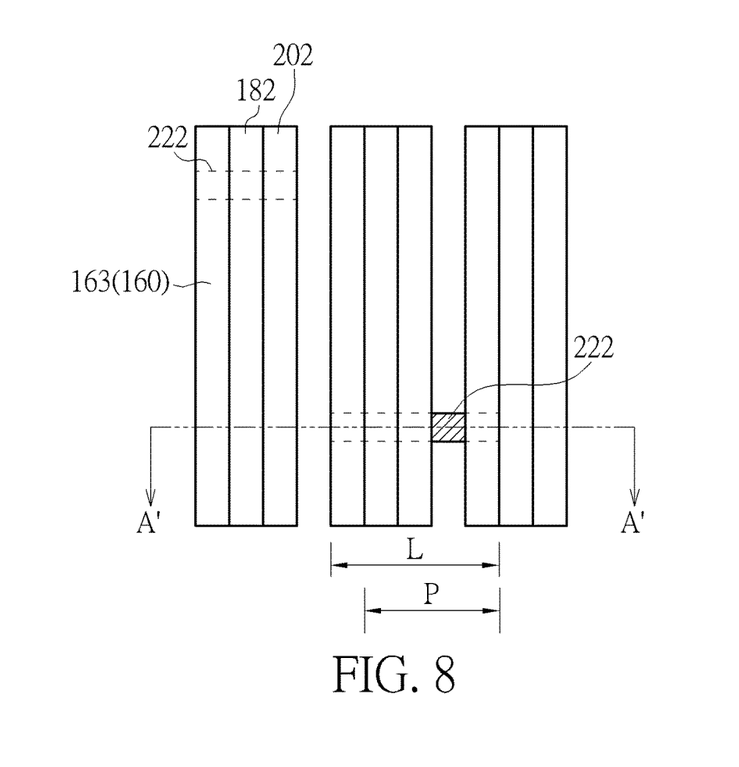
Figure 9:
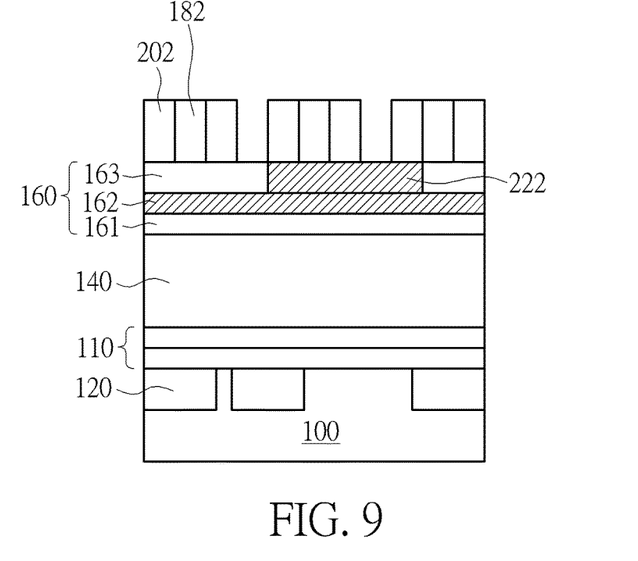
Figure 11:
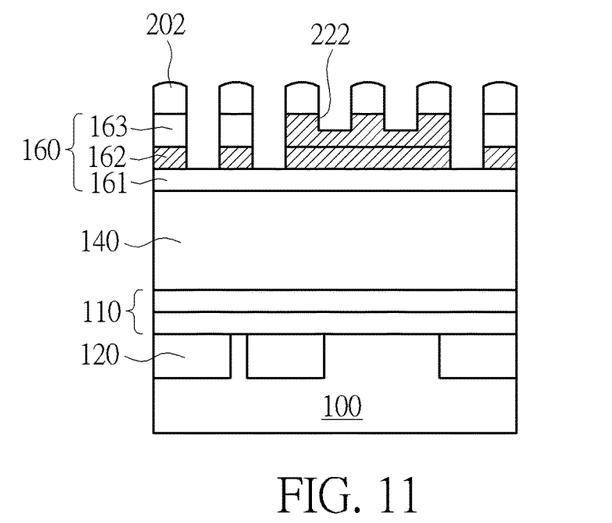
Figure 12:
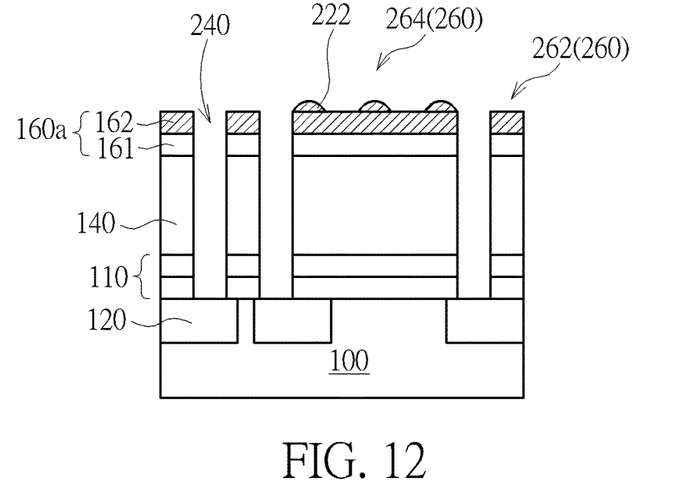
Figure 13:
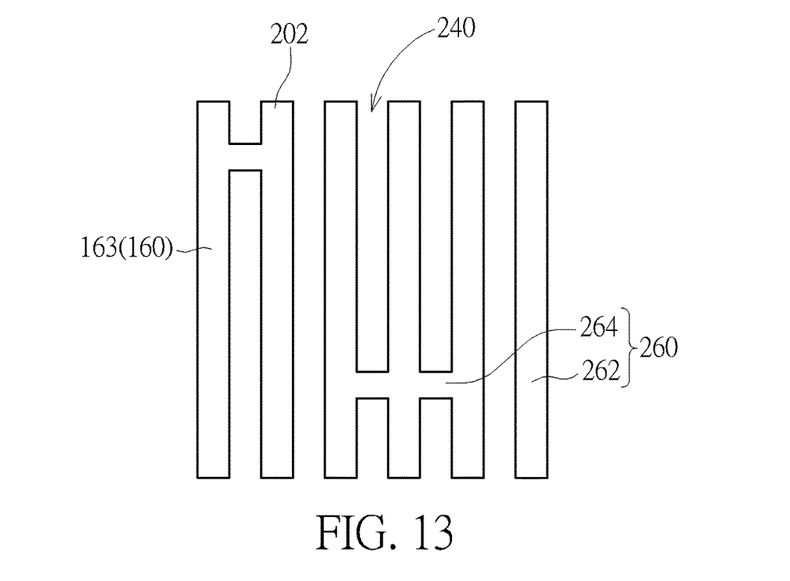

Please refer to FIG. 5 to FIG. 13, which are schematic diagrams illustrating a method of forming a semiconductor device according to the second embodiment of the present invention, wherein FIG. 5, FIG. 8, and FIG. 13 show the top views of the semiconductor device in forming steps, and FIG. 6 and FIG. 9 show the cross-sectional views taken along the cross line A-A' in FIG. 5 and FIG. 8. The formal steps in the present embodiment are similar to those in the first embodiment, which include sequentially forming the etching stop layer 110, the target layer 140, the hard mask layer 160 and at least one sacrificial pattern 182 on the substrate 100, and forming the at least one conductive layer 120 in the substrate 100. Also, it is noted that, the detailed materials and forming method of the etching stop layer 110, the conductive layer 120, the target layer 140, the hard mask layer 160 and the sacrificial pattern 182 are all similar to those in the aforementioned first embodiment substantially, or are well known in the art and will not be further detailed herein.

The differences between the present embodiment and the aforementioned first embodiment are that, a blocking pattern 222 is firstly formed on the substrate 100 before the at least one sacrificial pattern 182 is formed. Precisely, in the present embodiment, at least one portion of the hard mask layer 160 is replaced with the blocking pattern 222. The forming method of the blocking pattern 222 may include firstly removing a portion of the hard mask layer 160, like a portion of the silicon oxide layer 163 for example, so as to form an opening 164 in the hard mask layer 160, as shown in FIG. 5 and FIG. 6. Next, the blocking pattern 222 is formed in the opening 164, wherein the blocking pattern 222 is level with the hard mask layer 160 (namely the silicon oxide layer 163), as shown in FIG. 7. In one embodiment, the blocking pattern 222 may include a material having etching selectivity relative to the silicon oxide layer 163, such as a tungsten containing material or the same material as the metal nitride layer 162, like tantalum nitride or titanium nitride. Specifically, the formation of the blocking pattern 222 may include forming a blocking material layer (not shown in the drawings) on the silicon oxide layer 163, to fill the opening 164, and performing a planarization process, such as a chemical mechanical polishing (CMP), an etching process or a combination thereof, to level the blocking material layer and the silicon oxide layer 163 for forming the blocking pattern 222, but is not limited thereto. In another embodiment, according to the material exposed from the opening 164, like the characterization of the metal nitride layer 164 for example, the blocking pattern 222 formed therein the opening 164 may also be formed through a selectively deposition process or an oxidation process.

Then, similar to the processes shown in FIGS. 1-2 of the aforementioned first embodiment, at least one self-aligned double-patterning process, also known as sidewall image transfer process is performed, to form a plurality of the sacrificial patterns 182 paralleled to each other on the hard mask layer 160 and spacers 202 surrounding the sacrificial patterns 182, as shown in FIG. 8 and FIG. 9. Please note that, each of the sacrificial patterns 182 and each of the spacers 202 surrounding the sacrificial patterns 182 cross above the hard mask layer 160 and the blocking pattern 222, and overlap at least one of the sacrificial patterns 182 and one spacer 202 surrounding the at least one sacrificial pattern 182 in a projecting direction being perpendicular to the substrate 100. Also, in one embodiment, the blocking pattern 222 may have a length L being greater than a pitch P between the sacrificial patterns 182, as shown in FIG. 8.

Figure 10:
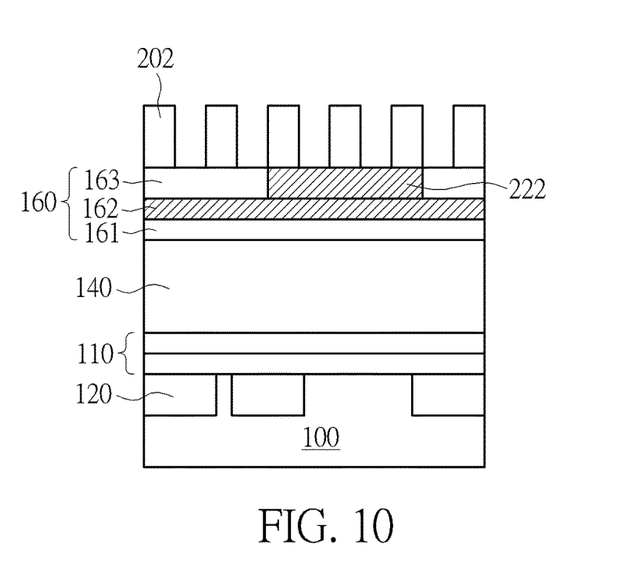

Following these, the sacrificial patterns 182 may be completely removed as shown in FIG. 10, and an etching process, for example a dry etching process, a wet etching or a sequentially performed dry and wet etching process, may be performed then by using the spacers 202 and the blocking pattern 222 underneath as a mask, to transfer patterns of the spacers 202 and the blocking pattern 222 to the hard mask layer 160 underneath. In the present embodiment, the patterns of the spacers 202 may be firstly transferred to a portion of the hard mask layer 160, for example, only the silicon oxide layer 163 and the metal nitride layer 162, but not limited thereto. It is worth noting that, a portion of the hard mask layer 160 (namely, the silicon oxide layer 163) has been replaced with the blocking pattern 222, so that, while the patterns of the spacers 202 is transferred, the blocking pattern may only be slightly etched due to different etching selectivity, as shown in FIG. 11. In other words, while the etching process is performed, the silicon oxide layer 163 and the metal nitride layer 162 exposed from the spacers 202 may be completely removed, but the blocking patterns 222 exposed from the spacers 202 may only be partially removed, thereby being formed in a battlement-shape shown in FIG. 11. Meanwhile, the metal nitride layer 162 disposed under the blocking pattern 222 may be shelter from the etching, and may not be removed during the etching process, so that, the patterns of the spacers 202 may not be successfully transferred to the metal nitride layer 162 under the blocking pattern 222. In other words, only a portion of the hard mask layer 160 is patterned.

After that, the spacers 202 may be optionally removed or remained, and another etching process, for example a dry etching process, a wet etching or a sequentially performed dry and wet etching process, may be performed by using the patterned hard mask layer 160 as a mask, to form at least one opening 240 in the target layer 140 to connect to the conductive layer 120 underneath and to define at least one fin shaped structure simultaneously, as shown in FIG. 12. It is noted that, in the embodiment of completely removing the spacers 202 before the etching process, a portion of the hard mask layer 160 (for example, the silicon oxide layer 163) may also be optionally removed while the spacers 202 are removed, as shown in FIG. 12.

In addition, it is worth noting that, the forming method of the present invention mainly utilizes the blocking pattern 222 to block at least one portion of the patterns of the spacers 202, so that, the openings 240 paralleledly arranged and spaced from each other may be defined accordingly, as shown in FIG. 13. Also, a portion of the openings 240 may be divided into two parts due to being blocked by the blocking pattern 222. In this manner, the fin shaped structures 260 formed between the openings 240 may have a portion being connected with each other, as shown in FIG. 13. In other words, the fin shaped structures 264 formed below the blocking pattern 222 may cross the fin shaped structures 262 formed below the patterned hard mask layer 160, so as to form fin shaped structures 262, 264 which are interlace from each other.

It is also worth noting that, while removing the rest spacers 202 and the hard mask layer 160, the blocking pattern 222 may not be completely removed due to different etching selectivity. Thus, a portion of the blocking pattern 222 still remains on the fin shaped structures 264, as shown in FIG. 12. Precisely speaking, only a portion of the patterned hard mask layer 160 (namely, the metal nitride layer 162 and the silicon oxide layer 161) remains on the fin shaped structures 262, and the portion of the patterned hard mask layer 160 may be etched to plural units 160a disposing on each of the fin shaped structures 262. On the other hands, the portion of the blocking pattern 222 and a portion of the hard mask layer 160 (namely, the metal nitride layer 162 and the silicon oxide layer 161) remain on the fin shaped structures 264, so that, the fin shaped structures 264 have a relative thicker film remained on top, in comparison with that of the fin shaped structures 262.

Finally, a cleaning process may be optionally performed, for example, using argon to clean surfaces of the openings 240 in the target layer 140 (namely, the inter-layer dielectric layer). After that, other semiconductor processes, such as a silicidation process or a plug process, may be optionally performed in the subsequent process, to form a semiconductor device (not shown in the drawings) which directly contacts the conductive layer 120, like a contact plug or a wiring, for example. Please note that, in the embodiment of having the target layer 140 of the semiconductor material, a dual-gate transistor device (not shown in the drawings) may be formed subsequently, to cross the fin shaped structures 262, 264, wherein the dual-gate transistor device may be formed on fin shaped structures 262, 264 having different thickness of films disposed thereon.

Through the aforementioned processes, the semiconductor device according to the second embodiment of the present invention is obtained. In the second embodiment of the present invention, the forming method thereof replaces a portion of the hard mask layer with the blocking pattern, and then forms the sacrificial patterns and the spacers on the hard mask layer, for blocking a portion of the patterns of the spacers. Thus, the semiconductor device formed accordingly may obtain specific layout. Since the blocking pattern of the present embodiment is formed below the spacers, and being defined by an opening pattern, the critical dimension of the blocking pattern may be precisely controlled, substantially being 20 nm to 60 nm for example. According to these, the present invention is able to form blocking patter in a relative smaller dimension, so that, the semiconductor device formed accordingly may obtain further specific layout.

Figure 14:
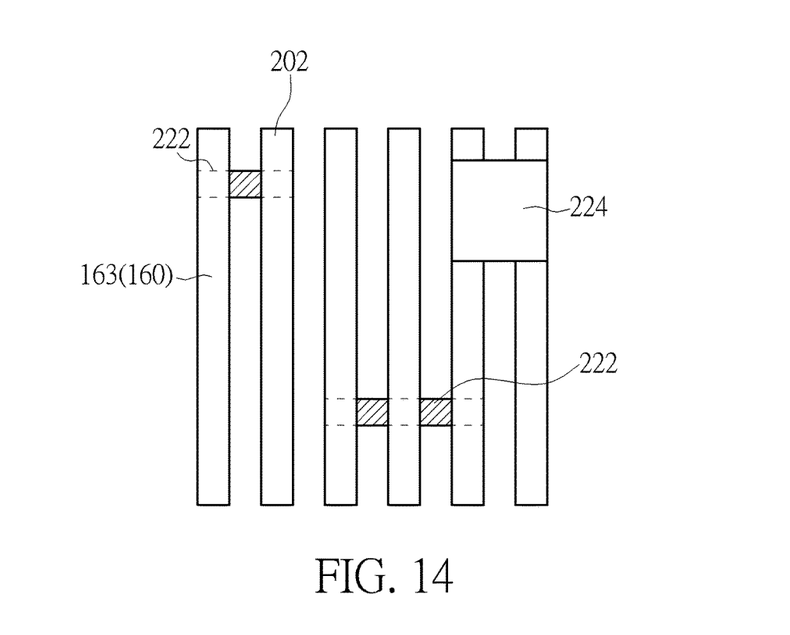
FIG. 14 is a schematic diagram illustrating a method of forming a semiconductor device according to a third embodiment of the present invention.

Please refer to FIG. 14, which is a schematic diagram illustrating a method of forming a semiconductor device according to the third embodiment of the present invention. The formal steps in the present embodiment are similar to those in the second embodiment shown in FIGS. 5-10, and the differences between the present embodiment and the aforementioned second embodiment are that, in addition to form the blocking pattern 222 in the opening 164, a blocking pattern 224 may also be formed on the spacers 202, after removing the sacrificial patterns 182. The blocking pattern 224 may cross and cover at least one of the spacers 202, as shown in FIG. 14. Also, in a preferred embodiment, the blocking patter 224 may not overlap the blocking pattern 222 in a projecting direction being perpendicular to the substrate 100, but is not limited thereto. With such arrangement, in the subsequent etching process (not shown in the drawings), the etching process may be performed by simultaneously using the blocking pattern 224, spacers 202 and the blocking pattern 222 as a mask. Also, please note that, since the blocking pattern 224 is formed on the hard mask layer 160 and the spacers 202 through the photolithography process, which may obtain a relative greater dimension in comparison with the blocking pattern 222, for example, being substantially greater than 60 nm, and preferably being between 60 nm to 90 nm, but is not limited thereto.

Through the aforementioned processes, the semiconductor device according to the third embodiment of the present invention is obtained. In the third embodiment of the present invention, the forming method thereof mainly forms blocking patterns having different dimensions below and above the spacers respectively, such that, the semiconductor device formed accordingly may obtain specific layout. In this manner, the present invention enables to form blocking pattern in a ranged dimension, so as to form semiconductor device in further specific layout.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor device, comprising:
   forming a first pattern on a target layer;
   forming a plurality of second patterns on the target layer, wherein a portion of the second patterns crosses the first pattern, and another portion of the second patterns does not cross the first pattern;
   forming a plurality of the spacers surrounding the second patterns, and disposed on the first pattern; and
   performing a removing process to remove a portion of the target layer by using the spacers and the first pattern as a mask.

2. The method of forming the semiconductor device according to claim 1, wherein the first pattern overlaps at least one of the second patterns in a projecting direction.

3. The method of forming the semiconductor device according to claim 1, further comprising:
   forming a hard mask layer on the target layer; and
   replacing a portion of the hard mask layer with the first pattern.

4. The method of forming the semiconductor device according to claim 3, wherein the first pattern comprises tungsten, tantalum nitride, or titanium nitride.

5. The method of forming the semiconductor device according to claim 3, wherein the first pattern is level with the hard mask layer.

6. The method of forming the semiconductor device according to claim 1, wherein the first pattern has a dimension of about 20 nm to 60 nm.

7. The method of forming the semiconductor device according to claim 1, further comprising:
   removing the second patterns before the removing process.

8. The method of forming the semiconductor device according to claim 7, after removing the second patterns further comprising:
   forming a third pattern on the spacers, wherein the third pattern covers and crosses at least one of the spacers.

9. The method of forming the semiconductor device according to claim 8, wherein the third pattern has a dimension of about 60 nm to 90 nm.

10. The method of forming the semiconductor device according to claim 8, wherein the third pattern does not overlap the first pattern in a projecting direction.

11. The method of forming the semiconductor device according to claim 8, wherein in the removing process, the portion of the target layer is removed by using the third pattern, the spacers and the first pattern as a mask.

12. The method of forming the semiconductor device according to claim 1, wherein the target layer comprises semiconductor material, conductive material or non-conductive material.

13. The method of forming the semiconductor device according to claim 1, wherein in the removing process further comprises:
    forming a plurality of openings paralleled to each other in the target layer, and a plurality of fin shaped structures between the openings.

14. The method of forming the semiconductor device according to claim 13, wherein the first pattern is disposed on one of the fin shaped structures.

15. The method of forming the semiconductor device according to claim 1, wherein the spacers comprise tungsten, tantalum nitride, titanium nitride, titanium dioxide or titanium dioxide.

\* \* \* \* \*